US011579222B2

United States Patent
Biber et al.

(10) Patent No.: US 11,579,222 B2
(45) Date of Patent: Feb. 14, 2023

(54) MAGNETIC RESONANCE TOMOGRAPHY SYSTEM WITH INTERFERENCE REDUCTION

(71) Applicant: Siemens Healthcare GmbH, Erlangen (DE)

(72) Inventors: Stephan Biber, Erlangen (DE); Rainer Schneider, Erlangen (DE); Stephan Kannengießer, Wuppertal (DE); David Grodzki, Erlangen (DE)

(73) Assignee: Siemens Healthcare GmbH, Erlangen (DE)

( * ) Notice: Subject to any disclaimer, the term of this patent is extended or adjusted under 35 U.S.C. 154(b) by 0 days.

(21) Appl. No.: 17/532,033

(22) Filed: Nov. 22, 2021

(65) Prior Publication Data
US 2022/0187394 A1 Jun. 16, 2022

(30) Foreign Application Priority Data
Dec. 11, 2020 (DE) .................... 10 2020 215 738.3

(51) Int. Cl.
*G01R 33/36* (2006.01)
*G01R 33/422* (2006.01)
(Continued)

(52) U.S. Cl.
CPC ..... *G01R 33/3621* (2013.01); *G01R 33/3692* (2013.01); *G01R 33/422* (2013.01); *G01R 33/543* (2013.01); *G01R 33/5659* (2013.01)

(58) Field of Classification Search
CPC ............ G01R 33/3621; G01R 33/3692; G01R 33/422; G01R 33/543; G01R 33/5659
See application file for complete search history.

(56) References Cited

U.S. PATENT DOCUMENTS

2008/0048658 A1 2/2008 Hushek
2016/0069970 A1* 3/2016 Rearick ............. G01R 33/3614
324/309

(Continued)

FOREIGN PATENT DOCUMENTS

WO 2019068687 A2 4/2019

OTHER PUBLICATIONS

German Office Action for German Application No. 10 2020 215 738.3 dated Oct. 20, 2021.

*Primary Examiner* — G. M. A Hyder
(74) *Attorney, Agent, or Firm* — Lempia Summerfield Katz LLC (57) ABSTRACT

To operate a magnetic resonance tomography system, first analysis signals are received by a main receive antenna and an auxiliary receive antenna. Based thereon, a first interference source and first weighting factors are determined. Second analysis signals are received by the main receive antenna and the auxiliary receive antenna and in accordance with the first weighting factors, a combination of the second analysis signals is created. Based thereon, a second interference source is determined. Second weighting factors are determined in order to suppress the influence of the first interference source and an influence of the second interference source. A magnetic resonance signal is received during an examination phase by the main receive antenna and an interference signal by the auxiliary receive antenna. An interference-suppressed magnetic resonance signal is created as a combination of the magnetic resonance signal and the interference signals depending on the second weighting factors.

18 Claims, 3 Drawing Sheets

1 Magnetic resonance tomography system
2 Longitudinal direction
10 Magnet unit
11 Field magnet
12 Gradient coils
14 Body coil
16 Patient tunnel
20 Control unit
21 Gradient controller
22 Radio-frequency unit
23 Controller
25 Signal bus
30 Patient table
33 Connecting line
36 Drive unit
50 Local coil
60 Auxiliary receive antenna
70 Receiver
100 Patient (51) Int. Cl.
G01R 33/54 (2006.01)
G01R 33/565 (2006.01)

(56) References Cited

U.S. PATENT DOCUMENTS

2017/0108569 A1 4/2017 Harvey
2020/0249292 A1 8/2020 Biber
2021/0103018 A1 4/2021 Biber et al.

* cited by examiner

FIG 1

| 1 | Magnetic resonance tomography system | 30 | Patient table |
|---|---|---|---|
| 2 | Longitudinal direction | 33 | Connecting line |
| 10 | Magnet unit | 36 | Drive unit |
| 11 | Field magnet | 50 | Local coil |
| 12 | Gradient coils | 60 | Auxiliary receive antenna |
| 14 | Body coil | 70 | Receiver |
| 16 | Patient tunnel | 100 | Patient |
| 20 | Control unit | | |
| 21 | Gradient controller | | |
| 22 | Radio-frequency unit | | |
| 23 | Controller | | |
| 25 | Signal bus | | |

FIG 2

50 Local coil
60 Auxiliary receive antenna
70 Receiver
71 Summation facility
72 Suppression facility

FIG 3

MAGNETIC RESONANCE TOMOGRAPHY SYSTEM WITH INTERFERENCE REDUCTION

The present patent document claims the benefit of German Patent Application No. 10 2020 215 738.3, filed Dec. 11, 2020, which is hereby incorporated by reference in its entirety.

TECHNICAL FIELD

The present disclosure relates to a method for operating a magnetic resonance tomography system, to a magnetic resonance tomography system and also to a computer product.

BACKGROUND

Systems for magnetic resonance tomography (MRT) are imaging apparatuses that, for imaging an examination object, align nuclear spins of the examination object with a strong external magnetic field and excite them by a magnetic alternating field for precession about the corresponding alignment. The precession or the return of the spins from this excited state into a state with lower energy in its turn creates a magnetic alternating field as a response, which may be detected via receive antennas.

With the aid of magnetic gradient fields, a spatial encoding may be impressed on the signals, which subsequently makes it possible to assign a received signal to a volume element of the examination object. The received signal may then be evaluated, e.g., to provide a three-dimensional imaging representation of the examination object. Local receive antennas, so-called local coils, may be used as receive antennas, which may be arranged directly on the examination object to achieve an improved signal-to-noise ratio (SNR). The receive antennas may also be arranged in the vicinity of the examination object or be built into a patient table, for example.

The MRT signals to be received for the imaging are extremely weak, so that with known MRT systems a screening of external interference signals is required in order to achieve a sufficient SNR. Complex screening cabins are installed in particular for this purpose in order to reduce the interference emissions. This leads to significant costs and to constructional restrictions because of the corresponding amount of space required.

In PCT publication no. WO 2019/068687 A2, a magnetic resonance tomography unit with active interference suppression and a corresponding method are described. In this case, a first receive antenna is provided for receiving a magnetic resonance signal from a patient and a second receive antenna for receiving an interference signal. A receiver connected to the receive antennas is configured to suppress the interference signal received with the second receive antenna in the magnetic resonance signal received from the first receive antenna. To this end, the interference signal is determined during the MRT sequences for signal acquisition, wherein periods of time may be used in which no MRT signal for imaging is expected. An interference suppression control may then combine the signals of the first receive coil and the second receive coil in a weighted manner in order to minimize the energy of the interference signals in the combined signal.

Because these periods differ in length, depending on the MRT sequence used, and they occur at different times, the method for interference suppression is adapted individually for each MRT sequence, which leads to an increased effort. Moreover, it may be possible, depending on the MRT sequence, that the available periods for determining the interference signal are not sufficiently long to achieve a reliable suppression of the influence of the interference.

SUMMARY AND DESCRIPTION

Against this background, it is the object of the present disclosure to specify an improved concept for a MRT system or for a method for operating such a system, through which the effort for screening out of external interference signals may be reduced and at the same time a high efficiency of the interference reduction is possible, in particular with as little adaptation effort as possible.

The scope of the present disclosure is defined solely by the appended claims and is not affected to any degree by the statements within this summary. The present embodiments may obviate one or more of the drawbacks or limitations in the related art.

The improved concept is based on analyzing the influence of a number of external interference sources by a main receive antenna and at least one auxiliary receive antenna even before the actual MRT measurement and determining weighting factors for combination of the signals of the main receive antenna and the at least one auxiliary receive antenna as exactly as possible beforehand.

In accordance with the improved concept, a method for operating an MRT system is specified that has a main receive antenna and also at least one auxiliary receive antenna arranged outside an examination region of the MRT system. A first analysis signal is received, during an analysis phase, by each of the main receive antenna and the at least one auxiliary receive antenna. Based on the first analysis signal, a first interference source is determined, (e.g., by an interference suppression facility of the MRT system), and first weighting factors are determined for the main receive antenna and the at least one auxiliary receive antenna, in order to suppress an influence of first interference signals at least partly. Based on the first analysis signals, a first interference source is determined. During the analysis phase, a second analysis signal is received by each of the main receive antenna and the at least one auxiliary receive antenna, and, in particular by the interference suppression facility, a combination of the second analysis signals is created in accordance with the first weighting factors. Based on the combination of the second analysis signals, a second interference source is determined. Second weighting factors for the main receive antenna and the at least one auxiliary receive antenna are determined, in particular by the interference suppression facility, in order to suppress at least partly the influence of the first interference source and an influence of the second interference source. During an examination phase lying after the analysis phase, a magnetic resonance signal is received by the main receive antenna from the examination region, in particular from an object that is located in the examination region and an interference signal is received by each auxiliary receive antenna of the at least one auxiliary receive antenna. An interference-suppressed magnetic resonance signal is created, in particular by the interference suppression facility, as a combination of the magnetic resonance signal and the interference signals, depending on the second weighting factors.

Depending on the interference-suppressed magnetic resonance (MR) signal, an (e.g., position-space) image may be created, which in particular represents the object.

The examination region of the MRT system may lie within a patient tunnel of the MRT system, for example. The at least one auxiliary receive antenna may be arranged outside the patient tunnel or in the vicinity of an opening of the patient tunnel. An opening through which a patient table with a patient may be moved into or out of the patient tunnel may be seen as the opening of the patient tunnel in this case. The at least one auxiliary receive antenna is arranged in the vicinity of an opening, so that this, for example, corresponds to a distance of less than 0.1 m, less than 0.2 m, less than 0.5 m, less than 1 m, or less than 2 m. In the vicinity of the opening may also correspond to a distance from the opening that is less than a quarter of a wavelength of a radio wave in the air with a Larmor frequency of the MRT system or is less than half of the wavelength.

In the examination phase, the main receive antenna may receive the magnetic resonance signal, which in the presence of interference sources however, as a rule also has a small portion of the interference signals. Conversely, during the examination phase, the at least one auxiliary receive antenna receives not only the interference signal but also a small part of the MR signal. Despite this, for the sake of simplicity, the signal received by the main receive antenna during the examination phase is referred to below as the MR signal and the signal received by the least one auxiliary receive antenna as the interference signal.

The determination of the first interference source or of the second interference source in particular includes the identification and/or characterization of the first interference source or of the second interference source. To this end, a check is made, for example, as to whether an amplitude of the respective first analysis signal is rising above a threshold value, which in particular is greater than a noise level. It may also be established in which spectral range the respective interference source occurs, whether it is spatially and/or temporally constant or variable and so forth. The interference source may also be identified with the aid of the frequency spectrum of the at least one analysis signal, for example, by the amplitude of the at least one analysis signal in the frequency space being compared with a corresponding threshold value, for example, a minimum value for an interferer-to-noise level.

The fact that the first and second weighting factors each involve weighting factors for the main receive antenna and the at least one auxiliary receive antenna may be understood in such a way that weighting factors are used for respective weighted summation of signals, which correspond to the respective output signals of the main receive antenna and the at least one auxiliary receive antenna, or which depend thereon. The weighting factors may be used for weighted summation of the first analysis signals, for weighted summation of the second analysis signals, or for weighted summation of the magnetic resonance signal with the interference signals. For example, the interference suppression facility may have a summation facility, which may form a combination, (e.g., a linear combination), of the output signals of the auxiliary receive antennas and the main receive antenna, which combination is dependent on the respective weighting factors.

The fact that the first weighting factors are determined in order to at least partly suppress the influence of the first interference source may in particular be understood in such a way that the first weighting factors are determined in such a way that a combination formed in accordance with the first weighting factors of the output signals of the main receive antenna and the at least one auxiliary receive antenna, (e.g., of the first analysis signals), has as little influence as possible of the first interference source. This may be achieved by zero points in the far field diagram of an antenna arrangement being created by the concrete choice of first weighting factors, wherein the antenna arrangement include the main receive antenna and the at least one auxiliary receive antenna.

To this end, the interference suppression facility, (e.g., a processing unit of the interference suppression facility), may vary the first weighting factors in such a way that the influence of the first interference source is as small as possible in the resulting combination, e.g., is minimized. If, during the analysis phase, no radio waves, (e.g., no excitation pulse), is emitted by the MRT system, then no MR signal is also to be expected during the analysis phase. Accordingly, the interference suppression facility may then also vary the first weighting factors in order to minimize overall an energy of the resulting combination.

The same applies by analogy for the second weighting factors, which are determined in a similar way, so that the influence of both the first and also the second interference source is minimized in the combination resulting from the second weighting factors.

In accordance with the method according to the improved concept, the number of interference sources are dealt with iteratively. First of all, the influence of the first interference source is minimized as much as possible and starting from this situation the influence of the second interference source is minimized as much as possible, without in this case letting the influence of the first interference source increase significantly again. In this way, a number of interference sources may effectively be reliably suppressed. In the determination of the respective weighting factors, the reciprocity of the antenna arrangement formed from the main receive antenna and the at least one auxiliary receive antenna may also be exploited, so that a plurality of receive spectra do not necessarily have to be recorded in order to vary the weighting factors or to minimize the influence.

The fact that the weighting factors are established not in the examination phase but in an upstream analysis phase, (e.g., during one or more so-called pre-scans), removes the need to separate the influences of the interference sources from the actual magnetic resonance signal, because, during the analysis phase, no such magnetic resonance signal is to be expected. Accordingly, the established weighting factors may subsequently also be used for different MRT sequences without the influences of the interference sources having to be minimized once again. Moreover, it is not necessary, during the MRT recording itself, specifically to identify sequence periods that are as free as possible from magnetic resonance signals.

Additionally, the improved concept also enables the use of screening cabins for screening from external noise influences to be dispensed with or the screening cabins may be configured more simply, which may save installation space and/or costs.

The first and/or second weighting factors may also be complex in order to take account of a phase shift.

The combination of the first analysis signal or the second analysis signal and also the combination of the magnetic resonance signal with the interference signals may be designed in each case as linear combinations. Also conceivable, however, are non-linear combinations depending on the respective weighting factors.

The at least one auxiliary antenna may include two or more auxiliary antennas. Accordingly, the interference suppression apparatus may weight analysis signals of the auxiliary receive antennas and/or the interference signals with large amplitude heavily compared to weaker analysis or interference signals, because, through a great ratio of the signal level compared to a statistical background noise, stronger interference signals may be well suppressed.

The interference suppression facility, (e.g., the processing unit of the interference suppression facility), may include a programmable logic unit, (e.g., a Field Programmable Gate Array (FPGA) or a Digital Signal Processor (DSP)). The creation of the interference-suppressed magnetic resonance signal may then be carried out in real time, for example.

It is also possible for the interference suppression apparatus to have a memory, which first stores the interference signals and also the magnetic resonance signal. The interference-suppressed magnetic resonance signal is not then created, for example, until a later time with a delay, for example, of the duration of an echo sequence, an excitation sequence, or an entire image acquisition of an individual slice or of the entire image acquisition sequence. The delay may be greater than 50 milliseconds (ms), greater than 100 ms, greater than 0.5 seconds (s), greater than 1 s, greater than 10 s, greater than 1 minute (min), or even longer.

To receive the analysis signals or the interference signals and the magnetic resonance signal, the MRT system may have a receiver. The receiver may be a component of the interference suppression facility or vice versa. The receiver may include hardware for analog and/or digital radio frequency processing, such as one or more amplifiers, mixers, or filters, and/or an image evaluation unit for later creation of the position-space image or other images from the interference-suppressed magnetic resonance signal.

In certain embodiments, final weighting factors for the main receive antenna and the at least one auxiliary receive antenna are determined depending on the second weighting factors and the combination of the magnetic resonance signal, (e.g., by the interference suppression facility), and the interference signal is created in accordance with the final weighting factors.

This means that the acts described with regard to the second interference source may be repeated for one or more further interference sources, so that the influence of the first and the second interference source is suppressed. Further, in a next act, the influence of the first interference source, the second interference source, and a third interference source is suppressed. Further, in a following act, the influence of the first, the second, the third interference source, and also a fourth interference source is suppressed, and so forth. In each act, the weighting factors may be further improved to the extent that the previously already partly suppressed influences continue to remain suppressed and the respective further interference source added in is likewise suppressed. Such an iterative approach allows the influence of a greater number of interference sources to be reliably and effectively suppressed, which with a single-stage approach, in which on the basis of a single optimization all influences of all interference sources are to be suppressed, is not possible or is only possible with a large amount of effort. An additional complicating factor here may be that the influences of the different interference sources may have a mutual influence on one another.

In accordance with the described iterative approach, the first interference source or the second interference source may also be analyzed again at a later time or in a later iteration act in order to suppress the corresponding influence even further. This may be advantageous when, through the suppression of a noise-like interferer, the overall noise level is lowered and thereby the influence of an interference previously dealt with comes to light again.

In accordance with at least one form of embodiment, at least one excitation pulse is transmitted in the examination region during the examination phase by a transmit antenna of the MRT system and the magnetic resonance signal is received in response to the at least one excitation pulse.

Through the at least one excitation pulse, in particular, the nuclear spins of an object in the examination region are excited for precession, so that their resonance may lead to the magnetic resonance signal.

During the examination phase, a homogeneous basic magnetic field is also created, (e.g., by a field magnet of the MRT system), as well as a sequence of magnetic field gradients, (e.g., by one or more gradient coils of the MRT system).

In accordance with at least one form of embodiment, no electromagnetic radiation is emitted by the transmit antenna during the analysis phase, in particular, during the entire analysis phase.

In particular, the transmit antenna thus does not transmit an excitation pulse into the examination region during the analysis phase.

During the analysis phase, the homogeneous basic magnetic field and the magnetic field gradients are also not created. In certain embodiments, there may also be provision to also create the homogeneous basic magnetic field and/or the magnetic field gradients during the analysis phase.

The fact that during the entire analysis phase no electromagnetic radiation is emitted by the transmit antenna enables it to be insured that a regular magnetic resonance signal is not to be expected during the analysis phase, so that the main receive antenna and also the at least one auxiliary receive antenna exclusively acquire external interference as a result of the interference sources or, for example, as a result of thermal background noise and so forth. This makes the determination of the weighting factors for suppressing the respective interference sources easier, and accordingly more reliable, or it may be that there are fewer iteration acts necessary in order to achieve an overall result that is as good as possible.

In accordance with at least one form of embodiment, to determine the first weighting factors, an influence of the first interference source on the combination of the first analysis signals in accordance with the first weighting factors is minimized. Additionally, or alternatively, to determine the second weighting factors, an influence of second interference source and of the first interference source on the combination of the second analysis signals in accordance with the second weighting factors is minimized.

To determine the weighting factors or to minimize the influence of the respective interference sources, correlation functions of the first analysis signals or correlation functions of the second analysis signals may be determined, for example, in order to determine the respective weighting factors. Additionally, or alternatively, known optimization algorithms may be employed. The optimization algorithm may be chosen in this case depending on the characterization of the respective interference sources.

It is further possible for the determination of the first weighting factors itself to be done iteratively. In this way, after the determination of the first interference source and where necessary its characterization, an initial set for the first weighting factors may be determined as described and then further first analysis signals may be received by the main receive antenna and the at least one auxiliary receive antenna, wherein for example a receive bandwidth may be restricted to the bandwidth of the first interference source, the recording may be averaged and/or the averaging duration may be adapted in such a way that a predetermined minimum INR results.

This enables the first interference source to be considered in greater detail, so that its influence may be more reliably suppressed. The same also applies by analogy to the analysis of the second interference source and also if necessary of further interference sources.

In accordance with at least one form of embodiment a variation method or a linear optimization method or a method in accordance with the least squares method is carried out, (e.g., by the interference suppression facility), in order to minimize the influence of the first interference source and/or in order to minimize the influence of the first interference source with the second interference source.

In accordance with at least one form of embodiment, at least one first characteristic variable of the first interference source is determined based on the first analysis signals, in particular in order to characterize the first interference source, and the first weighting factors are determined depending on the at least one first characteristic variable.

In accordance with at least one form of embodiment at least one second characteristic variable of the second interference source is determined based on the combination of the second analysis signals, in particular in order to characterize the source, and the second weighting factors are determined depending on the at least one second characteristic variable.

The at least one first characteristic variable and/or the at least one second characteristic variable may involve or include a spectral range, a mid-frequency, a location dependency, and/or a time dependency of the respective first or second interference source.

In this way, the type of the respective interference source may be taken into account, in order to select optimization algorithms that are as effective or efficient as possible.

In accordance with at least one form of embodiment, the first interference source involves an approximately frequency-discrete, (e.g., approximately mono-frequent), interference source and the second interference source involves a noise-like or wideband interference source.

In other words, the first interference source may involve a so-called continuous wave (CW) interference source. The frequency-discrete interference source in this case is in particular characterized in that its emission spectrum is only greater in a predetermined narrow frequency range than a predetermined minimum amplitude, while a noise-like interference source is characterized in that the source has a wider emission spectrum. In other words, the frequency-discrete interference source emits at a defined frequency, while the noise-like interference source emits in a wide frequency band. What may be seen here as wide and narrow, or as constant or discrete, depends on the individual frequencies employed. For example, interference sources may be seen as approximately frequency-discrete that have a bandwidth of less than 1 kHz, less than 500 Hz, less than 100 Hz, less than 50 Hz, or less than 10 Hz. Interference sources with a bandwidth of more than 1 kHz, more than 5 kHz, or more than 10 kHz may be seen as noise-like, for example.

In accordance with at least one form of embodiment, one or more further frequency-discrete interference sources are identified during the analysis phase and the first weighting factors are determined in such a way that the influence of the one or more further frequency-discrete interference sources is at least partly suppressed.

The procedure may be as explained for the first interference source. In particular, the first interference source and the one or more frequency-discrete interference sources may be analyzed in consecutive iterative acts and their influence suppressed accordingly.

In this case, it is of particular advantage to analyze the first interference source and also the one or more further frequency-discrete interference sources before the second interference source identified as the noise-like interference source and to suppress their influence and only thereafter to analyze and to suppress the influence of the second interference source.

This may be advantageous because the frequency-discrete interference sources may emit with a relatively high energy, so that these may be identified even with relatively high proportion of background noise, caused by thermal background noise and/or the noise-like interference sources. After the second interference source has been analyzed and its influence suppressed, if necessary, further influences of the first interference source and of the one or more further frequency-discrete interference sources may be further suppressed, when for example, by reduction of the influence of the second interference source, these are only now able to be recognized sufficiently.

In this way, a suppression of the influences of a plurality of frequency-discrete and/or noise-like interference that is as complete as possible may be achieved.

In accordance with at least one form of embodiment, a first interference bandwidth of the first interference source is determined based on the first analysis signals. A further first analysis signal is received by each of the main receive antenna and the at least one auxiliary receive antenna, wherein a receive bandwidth for receiving the further first analysis signals is defined depending on the first interference bandwidth. The first weighting factors are determined based on the further first analysis signals.

This thus enables the receive bandwidth to be configured to the first interference bandwidth of the first interference source, in order to achieve an analysis that is as detailed as possible and accordingly a suppression of the influence of the first interference source that is as complete as possible.

In accordance with at least one form of embodiment, a second interference bandwidth of the second interference source is determined based on the second analysis signals and a further second analysis signal is received by each of the main receive antenna and the at least one auxiliary receive antenna, wherein a receive bandwidth for receiving the further second analysis signals is defined depending on the second interference bandwidth. The second weighting factors are determined based on the further second analysis signals.

In accordance with the improved concept, an MRT system is also specified, which has a main receive antenna and at least one auxiliary receive antenna arranged outside an examination region of the MRT system, in order to receive a first analysis signal during an analysis phase by each of the main receive antenna and the at least one auxiliary receive antenna. The MRT system has an interference suppression facility, which is configured, based on the first analysis signals, to determine a first interference source and to determine first weighting factors for the main receive antenna and the at least one auxiliary receive antenna, in order to reduce an influence of the first interference source at least partly. In this case, the interference suppression facility is configured, in accordance with the first weighting factors, to create a combination of second analysis signals, wherein during the analysis phase one of the second analysis signals is received by each of the main receive antenna and the at least one auxiliary receive antenna and based on the combination of the second analysis signals, to determine a second interference source. The interference suppression facility is configured to determine second weighting factors for the main receive antenna and the at least one auxiliary receive antenna, in order to suppress the influence of the first interference source and an influence of the second interference source at least partly. The interference suppression facility is configured to create an interference-suppressed magnetic resonance signal as a combination of a magnetic resonance signal with interference signals, wherein, during an examination phase lying after the analysis phase, the magnetic resonance signal is received by the main receive antenna and during the examination phase, one of the interference signals is received by each auxiliary receive antenna of the at least one auxiliary receive antenna.

In accordance with at least one form of embodiment of the MRT system according to the improved concept, the system has a transmit antenna and also a control unit, wherein the control unit is configured to control the transmit antenna in such a way that the antenna transmits at least one excitation pulse into the examination region during the examination phase and/or does not emit any electromagnetic radiation during the analysis phase.

Further forms of embodiment of the MRT system according to the improved concept follow on directly from the various forms of embodiment of the method according to the improved concept and vice versa. In particular, an MRT system in accordance with the improved concept is configured or programmed to carry out a method according to the improved concept or it carries out such a method.

In accordance with the improved concept, a computer program with commands is also specified. When the computer program or the commands are executed by an MRT system according to the improved concept the commands cause the MRT system to carry out a method according to the improved concept.

In accordance with the improved concept, a computer-readable storage medium is also specified, which stores a computer program according to the improved concept.

The computer program and also the computer-readable storage medium may be construed as computer program products with the commands.

The features and combinations of features given in the description as well as the features and combinations of features given below in the description of the figures and/or in the figures alone are able to be used not only in the specified combination in each case, but also in other combinations, without departing from the framework of the disclosure. Also to be seen as disclosed are versions and combinations of features that do not have all features of an originally formulated independent claim and/or which go beyond the combinations of features presented in the references of the claims or which differ from them.

DETAILED DESCRIPTION

Figure 1:
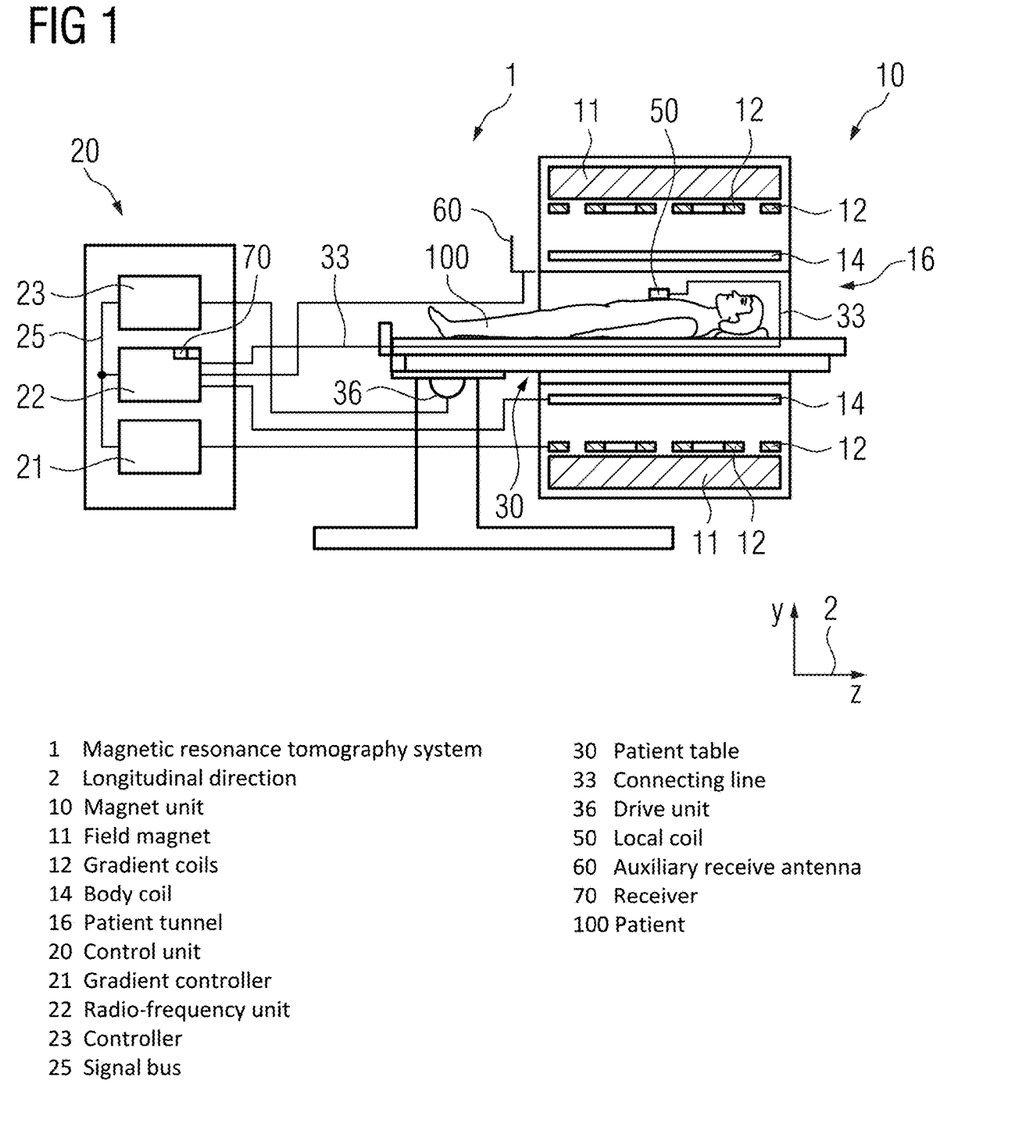
FIG. 1 depicts a schematic diagram of an example of a form of embodiment of an MRT system in accordance with the improved concept.

FIG. 1 depicts a schematic diagram of an example of a form of embodiment of an MRT system 1 in accordance with the improved concept.

The MRT system 1 has a magnet unit 10 with a field magnet 11, which creates a static magnetic field for aligning nuclear spins of a sample, (e.g., of a patient 100), in an examination region or receiving region. The receiving region is characterized by an extremely homogeneous static magnetic field, wherein the homogeneity relates in particular to the magnetic field strength or to its amount. The receiving region may be almost spherical and is positioned in a patient tunnel 16, which extends in a longitudinal direction 2 through the magnet unit 10. The field magnet 11 may involve a superconducting magnet, for example, which may provide magnetic fields with a magnetic flux density of up to 3 T or more. For lower field strengths, permanent magnets or electromagnets with normally-conducting coils may also be used. A patient table 30 may be able to be moved in the patient tunnel 16 by a drive unit 36.

Furthermore, the magnet unit 10 has gradient coils 12, which are configured for spatial differentiation of the acquired imaging regions in the receiving regions, to superimpose on the static magnetic field location-dependent magnetic fields in the three spatial directions. The gradient coils 12 may be configured as coils of normally-conducting wires, which may create fields of field gradients orthogonal to one another in the receiving region.

The magnet unit 10 may have a body coil 14 as a transmit antenna, which is configured to radiate a radio-frequency signal supplied via a signal line into the examination region. The body coil 14 may also be used in some forms of embodiment to receive resonance signals emitted by the patient 100 and to output them via a signal line. The body coil 14 in such forms of embodiment may thus serve as the main receive antenna and also as a transmit antenna.

The MRT system 1 has a control unit 20, which may supply the magnet unit 10 with different signals for the gradient coils 12 and the body coil 14 and may evaluate the received signals. The control unit 20 may have a gradient controller 21, for example, which is configured to supply the gradient coils 12 via supply lines with variable currents that, with coordinated timing, may provide the desired gradient fields in the examination region.

The control unit 20 may also have a radio-frequency unit 22, which is configured to create radio-frequency pulses or excitation pulses with predetermined timing waveforms, amplitudes, and spectral power distribution for exciting a magnetic resonance of the nuclear spins in the patient 100. In this case, pulse powers in the region of kilowatts may be employed. The excitation pulses may be radiated into the patient 100 via the body coil 14 or via one or more local transmit antennas. The control unit 20 may also contain a controller 23, which may communicate via a signal bus 25 with the gradient controller 21 and the radio-frequency unit 22.

Optionally, a local coil 50 may be arranged in the immediate vicinity of the patient 100, for example, on the patient 100 or in the patient table 30, which may be linked via a connecting line 33 to the radio-frequency unit 22. Depending on the form of embodiment, the local coil 50, as an alternative or in addition to the body coil 14, may serve as the main receive antenna.

Moreover, the MRT system 1 has at least one auxiliary receive antenna 60, which is arranged outside the examination region, (e.g., outside the patient tunnel 16). In the example of FIG. 1, four auxiliary receive antennas 60 may be arranged on an edge of the opening of the patient tunnel 16, which may be arranged at the corners of a square, which is drawn onto the circular opening, so that the corners lie on the edge of the opening. Other arrangements of the one or more auxiliary receive antennas 60 are also possible.

Figure 2:
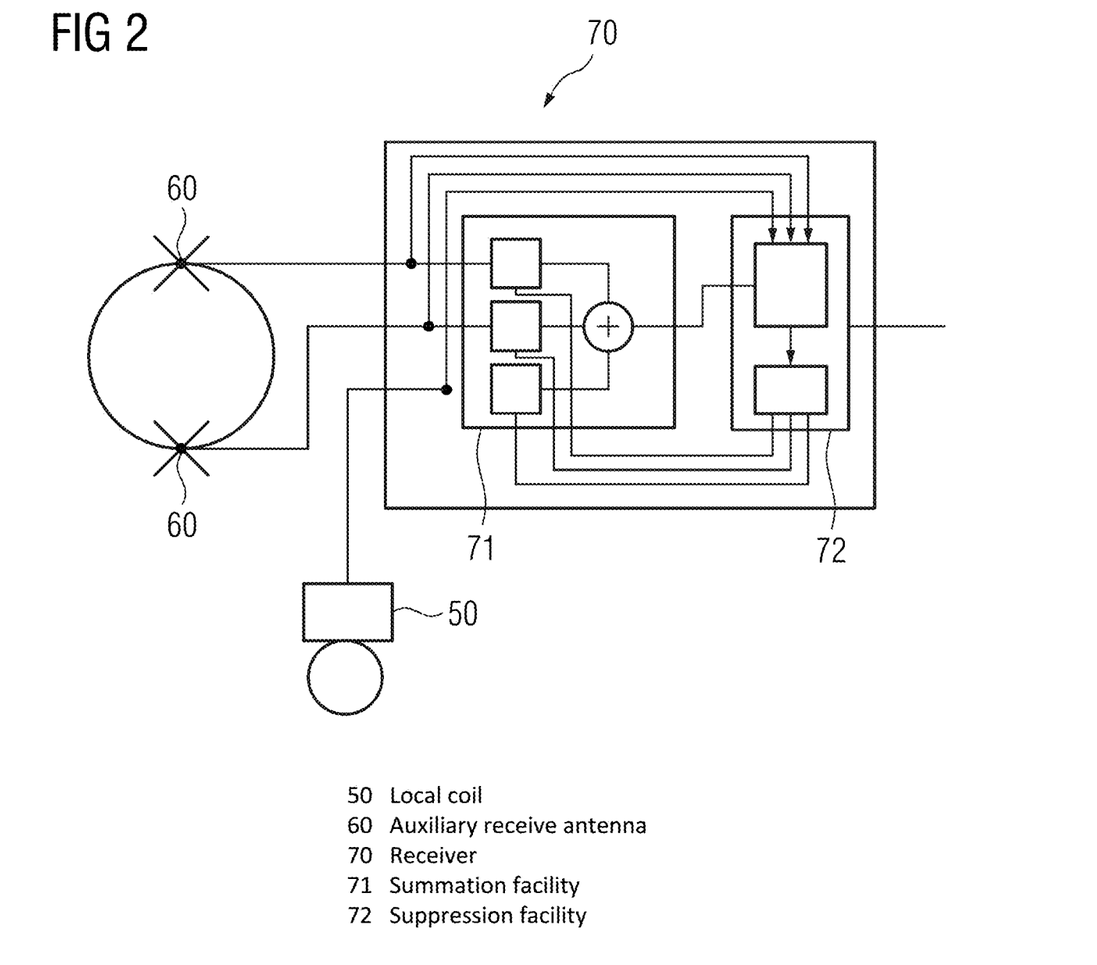
FIG. 2 depicts a schematic diagram of a part of a further example of a form of embodiment of an MRT system in accordance with the improved concept.

The auxiliary receive antennas 60 are connected for signaling to a receiver 70 of the control unit 20, wherein the receiver 70 includes an interference suppression facility 72, as shown schematically in FIG. 2, for example.

The auxiliary receive antennas 60 may each have an omnidirectional characteristic, but may also, at least in part, be configured as dipole antennas and mutually complement each other through their different alignment to give an omnidirectional characteristic. It is also conceivable for a single auxiliary receive antenna 60 to be provided, which may have an omnidirectional characteristic and may be configured as a cross dipole.

The patient 100, depending on the size of the patient tunnel 16, may act through their finite conductivity as the core of a coaxial conductor, of which the sheath is provided by the wall of the patient tunnel 16, and in this way transfer an electromagnetic signal coupled into the patient 100 at their leg end or head end into the examination region. If the auxiliary receive antennas 60 are arranged, for example, in the vicinity of the opening of the patient tunnel 16, the influence of external interferers may be compensated for especially effectively by this.

Shown in FIG. 2 is a part of the MRT system 1 from FIG. 1, wherein in particular the receiver 70 is shown schematically.

The receiver 70 may have a summation facility 71, for example, which may weight the signals from the body coil 14 and/or the local coil 50 and also the incoming signals from the auxiliary receive antennas 60 with parameters, wherein the parameters may also be complex in order to specify a phase shift. In a similarly configured receiver 70, this may be done by an adjustable amplifier in conjunction with an adjustable phase shifter. A real part of a parameter then corresponds to an amplification factor and an imaginary part of the parameter corresponds to the phase shift. After the weighting, the signals are summed accordingly. Other, (e.g., non-linear), signal operations are also possible for combination of the individual signals however.

The interference suppression facility 72 receives the combined signal and, for example, also the individual signals of the local coil 50 and/or of the body coil 14 or of the auxiliary receive antennas 60.

The MRT system 1, in an environment with a number of interferers, may determine the weighting factors of the individual auxiliary receive antennas 60 for interference suppression. To explain this more precisely, the way in which the MRT system 1 functions is explained in greater detail with regard to FIG. 3 with the aid of an example of a form of embodiment of a method according to the improved concept.

Figure 3:
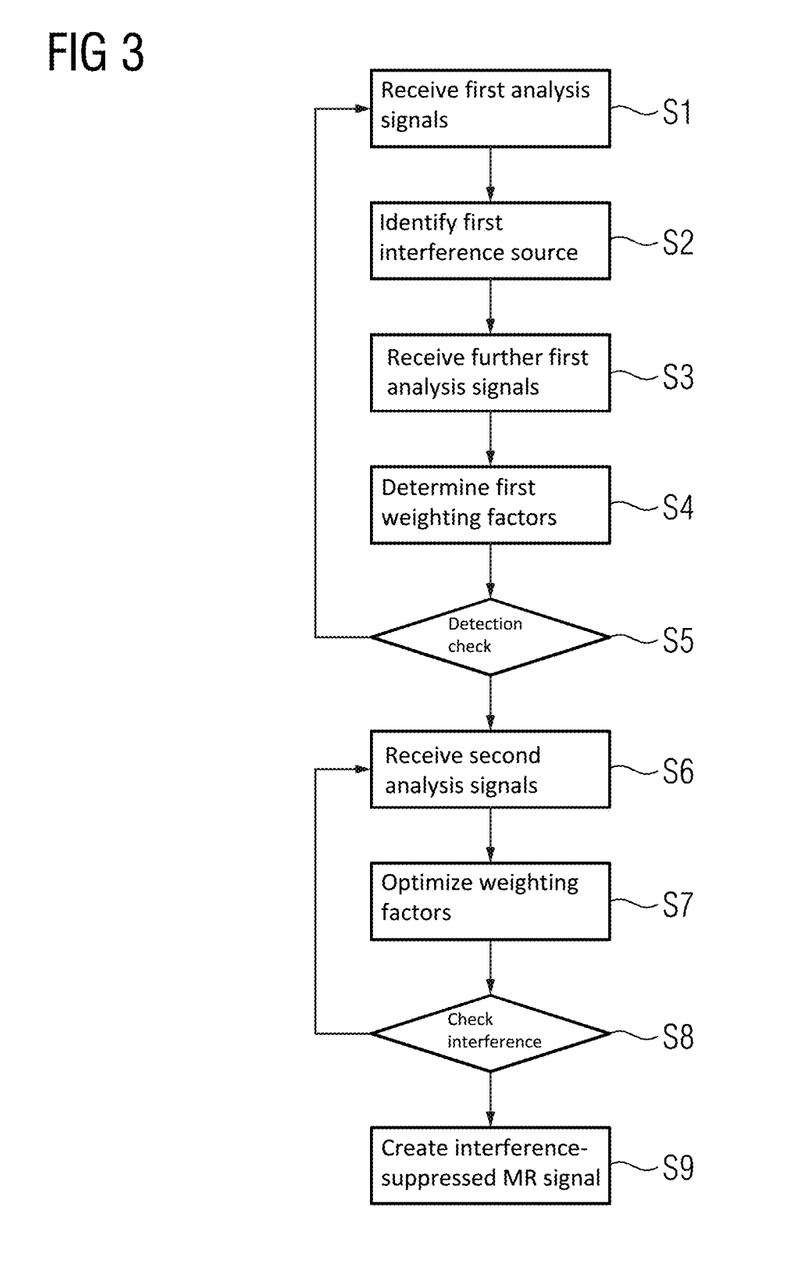
FIG. 3 depicts a flow diagram of an example of a form of embodiment of method according to the improved concept.

In act S1, during an analysis phase, a first analysis signal is received by the body coil 14 or the local coil 50 and a first analysis signal is received by the auxiliary receive antennas 60, wherein no excitation pulse is sent into the examination region by the body coil 14 or by another transmit antenna of the MRT system 1 during the analysis phase.

In act S2, the interference suppression facility 72, based on the first analysis signals, may identify a first interference source, (e.g., a frequency-discrete interference source), and if necessary characterize it, in that, for example, its mid frequency is determined.

Optionally, in act S3, a further first analysis signal may be received by the main receive antenna 14, 50 and a further first analysis signal may be received by the at least one auxiliary receive antenna 60, wherein the receive bandwidth is restricted to a first interference bandwidth of the first interference source.

In act S4, the interference suppression facility 72, based on the first analysis signals or the further first analysis signals, may determine first weighting factors for the summation facility 71, in that, for example, it minimizes the energy of the combined signals.

In act S5, further analysis signals may be received again by the main receive antenna 14, 50 and the at least one auxiliary receive antenna 60 in order to check whether, when the current weighting factors are used, further frequency-discrete interferers or interference sources are detectable. If necessary, acts S1 to S5 may accordingly be iteratively repeated, in order where possible to identify all frequency-discrete interference sources and minimize their influence.

In act S6, during the analysis phase, a second analysis signal is received by the main receive antenna 50, 14 and a second analysis signal is received by the at least one auxiliary receive antenna 60 and in accordance with current weighting factors that have been identified, if necessary iteratively, in the acts S1 to S5, a combined signal is accordingly created by the summation facility 71. In act S7, the weighting factors are now optimized once again, in order to suppress a second, noise-like interference source as well as the frequency-discrete interference sources.

Then, in act S8, a check may be made whether further noise-like interference sources are present or, after compensation for the influence of the second interference source, the influence of frequency-discrete interference sources is again able to be detected. Depending on the result, acts S6 to S8 and/or acts S1 to S5 may then be iteratively repeated, until it is established, in act S8, that no frequency-discrete interference sources are able to be identified any longer and also that the noise level lies below a predetermined limit value.

Further, in this iterative way, final weighting factors are thus determined for the summation facility 71, which may be used, in act S9, in an examination phase following on from the analysis phase, in order to create a combination of a magnetic resonance signal received by the main receive antenna 14, 50 from the examination region and interference signals received by the auxiliary receive antennas 60 and in this way to create an interference-suppressed magnetic resonance signal, in that the influence of the interference signals on the magnetic resonance signal is suppressed. The receiver 70 may pass on the interference-suppressed magnetic resonance signal received in this way to the controller 23 for imaging.

The interference source suppression described may also be carried out with a single auxiliary receive antenna 60. Conversely, it is possible for the receiver 70 to have a number of channels or for a number of receivers 70 to be provided in the MRT system 1 in order to suppress interference in magnetic resonance signals of a number of main receive antennas 14, 50. In this case, it is conceivable for the signals of the auxiliary receive antennas 60 to be used by a number of receivers 70 or by channels of the receiver or receivers 70 for interference suppression.

As described, in particular with regard to the figures, an option for noise reduction during operation of an MRT system is thus specified by the improved concept, through which the requirements for screening apparatus may be reduced and which allows a more reliable and more effective suppression of noise interferences.

Because MRT systems according to the improved concept may manage without screening cabins or with less complex screening cabins, the costs of the installation and in particular those of setting up a device at a different location are significantly reduced, because the installation depends significantly less on the building in which it is installed.

External interference sources may be time-variant and/or frequency-variant. Moreover, the external interference sources may be mode-variant, so that the field distribution that arrives at the MRT system changes its distribution spatially, for example, when the interference source moves or when other movable objects are located between the interference source and the MRT system. Through the improved concept time-variant, frequency-variant, and/or mode-variant signals may be recorded and subtracted from the usable MR signal. Unlike with mobile radio signals, the MR signal is an analog sensor signal, which itself does not carry any encoding that could be used for improvement of the signal-to-noise ratio.

The local coils in the patient tunnel are decoupled from the environment with around 20 to 50 dB, because the patient tunnel acts as a cut-off hollow conductor, in each case with systems with a static magnetic field of up to 3 T, and the propagation of a wave from entry into the patient tunnel to the local coil already suppressed in this way. The effectiveness of the suppression increases as the frequency falls for the same diameter of the patient tunnel. The patient, whose tissue is slightly conductive, acts as a monopole antenna, which protrudes from the patient tunnel and in this, together with sheath structures, forms a coaxial structure. Thus interferences may be caught and directed to the local coil. Similar effects may be caused by the coil cabling that protrudes from the patient tunnel. Through the improved concept, such effects may be compensated for or made weaker.

The improved concept may follow an approach for detecting interference sources before the actual MR measurement by the auxiliary receive antennas, which may be very effective for static interferers. Thus, in a multi-interferer environment the weights of the individual auxiliary receive antennas for interferer suppression are determined on the main receive antennas.

In a first act, for example, the entire relevant bandwidth is acquired by a wideband scan. This scan may already be optimized for the subsequent measurements by the parameters for the subsequent sequences being included, (e.g., bandwidth, pixel bandwidth, averaging factors, and so forth). If these parameters are not available, for example, because the examination is not yet planned or because this appears to be too complicated, a start may be made with standard parameters. In certain examples, a bandwidth in a range of 100 kHz to 250 kHz or up to 500 kHz may be sampled. The resolution bandwidth may lie in the order of magnitude of the pixel bandwidth, e.g., from 10 to 200 Hz/pixel. In order to assess the temporal constancy of the interferers in the environment, the scan may also be repeated a number of times, or also between the individual measurements.

Thereafter, the interferers may be roughly classified, for example, by their number being determined, whether they are temporally constant in the frequency space and/or in the position-space or whether their spectral range is constant. These properties may be used in order to select suitable strategies and algorithms for suppressing the interferers.

The result may then be spectrally analyzed. Frequency-discrete interferers or mono-frequent interferers that lie above the noise level may be analyzed in respect of their temporal constancy, in particular, by using multiple pre-scans. If the interference frequencies are constant, the number of interferers that have a specific minimum INR as well as their corresponding mid frequencies may be determined. If the frequency changes slightly, the recording bandwidth may be expanded slightly.

Now, a further scan may optionally be undertaken, which records the interferers with a higher INR in order to be able to determine the weighting factors as exactly as possible. In this case, the bandwidth may be restricted to the bandwidth of the interferer and/or the recording may be averaged. For example, the averaging duration may be adapted in such a way that a specific minimum INR is created. Subsequently, the weighting factors are established that make it possible to suppress each of these interferers, in particular, by zero points being created in the far field diagram of the antenna arrangement including main receive antenna and auxiliary receive antennas.

In regions that are free from frequency-discrete interferers, the noise level for noise-like interferers may be established. If this lies above a reference measure, then the noise level is caused by external interferers and not just by the thermal noise of the system itself. Extracts in the frequency range may now be determined by the noise being able to be established. The weighting factors may be established in such a way that they suppress the noise interferers. In this case, the procedure may be similar to that explained with regard to the frequency-discrete interferers. The weight factors may be established by adapting/expanding the weight factors already established for the mono-frequent interferers or by a recalculation, in particular, by the creation of further zero points in the far field diagram, without removing the zero points already created previously.

The acts may be carried out iteratively, so that after the establishment of the weighting factors for the first interferer a new spectrum is recorded, the interferer suppression with the established weight factors is applied to it and the procedure continues with next interferer.

The method may provide the advantage that many multifrequency interferers are already suppressed in a first iteration act, for example, with the assumption that the different frequencies that emit these, do not have significantly different propagation paths in the narrow bandwidth of the magnetic resonance signal. In this way, it may also be recognized whether the weighting factors are actually working correctly for interferer suppression. With the method, an optimally sensitive sampling of the interferer subspaces is achieved.

It may be advantageous first of all to carry out a suppression of the strong mono-frequent interferers and thereafter a suppression of the wideband interference signals. If thereafter, by the lowering of the noise level through the suppression of the noise-like interferers mono-frequent interferers are visible once again, the entire method may be iterated a further time. In this case, it may be insured that with a one-time optimization of the weighting factors, the influence of the strong interferers does not dominate, and the remaining interferers are not addressed. The process may be repeated as often as it takes to produce a spectrum that is free from peaks, (e.g., mono-frequent interferers), and which exceeds the thermal noise of the system itself only by a maximum of a limited factor. Finally, all pre-scans may be fed in in a global optimization of the weighting factors and their amount may be weighted individually.

Additionally, or alternatively, to the iterative method, an interferer-specific optimized pre-scan database may be created. In the MR scanner tune-up, for example, in a separate measurement, the interferer environment may be acquired locally and thus a sub selection of the pre-scan database and possibly the repetition rate of the recording defined. The measurement time and efficiency for the acquisition of the interferers may be improved thereby.

The methods described are helpful in particular for MRT systems with a RF cabin or with a part cabin but are also able to be used for MR systems, which are subject to interference from other electronic facilities or neighboring MRT systems. The methods are also advantageous for cabins with low screening attenuation.

The improved concept makes possible an iterative approach for establishing the weighting factors for suppressing mono-frequent and wideband-type external interferers.

It is to be understood that the elements and features recited in the appended claims may be combined in different ways to produce new claims that likewise fall within the scope of the present disclosure. Thus, whereas the dependent claims appended below depend from only a single independent or dependent claim, it is to be understood that these dependent claims may, alternatively, be made to depend in the alternative from any preceding or following claim, whether independent or dependent, and that such new combinations are to be understood as forming a part of the present specification.

Although the disclosure is illustrated and described in detail with reference to various embodiments, the disclosure is not restricted to the examples disclosed above and other variations may be derived therefrom by a person skilled in the art without departing from the scope of the disclosure. It is therefore intended that the foregoing description be regarded as illustrative rather than limiting, and that it be understood that all equivalents and/or combinations of embodiments are intended to be included in this description.

The invention claimed is:

1. A method for operating a magnetic resonance tomography system having a main receive antenna and at least one auxiliary receive antenna arranged outside an examination region, the method comprising:
receiving, during an analysis phase, a first analysis signal by the main receive antenna and a first analysis signal by each auxiliary receive antenna of the at least one auxiliary receive antenna;
determining, based on the first analysis signals of the main receive antenna and each auxiliary receive antenna, a first interference source and first weighting factors for the main receive antenna and the at least one auxiliary receive antenna in order to suppress an influence of the first interference source at least partly;
receiving, during the analysis phase, a second analysis signal by the main receive antenna and a second analysis signal by each auxiliary receive antenna of the at least one auxiliary receive antenna;
creating, using the first weighting factors, a combination of the second analysis signals of the main receive antenna and each auxiliary receive antenna;
determining, based on the combination of the second analysis signals, a second interference source;
determining second weighting factors for the main receive antenna and the at least one auxiliary receive antenna in order to suppress the influence of the first interference source and an influence of the second interference source at least partly;
receiving, during an examination phase after the analysis phase, a magnetic resonance signal from the examination region by the main receive antenna and an interference signal by each auxiliary receive antenna of the at least one auxiliary receive antenna; and
creating an interference-suppressed magnetic resonance signal as a combination of the magnetic resonance signal and the interference signals, depending on the second weighting factors.

2. The method of claim 1, wherein, depending on the second weighting factors, final weighting factors for the main receive antenna and the at least one auxiliary receive antenna are determined and the combination of the magnetic resonance signal of the main receive antenna and the interference of each auxiliary receive antenna is created in accordance with the final weighting factors.

3. The method of claim 2, wherein, during the examination phase, at least one excitation pulse is sent into the examination region by a transmit antenna of the magnetic resonance tomography system and the magnetic resonance signal is received in response to the at least one excitation pulse.

4. The method of claim 3, wherein, during the analysis phase, no electromagnetic radiation is emitted by the transmit antenna.

5. The method of claim 1, wherein, during the examination phase, at least one excitation pulse is sent into the examination region by a transmit antenna of the magnetic resonance tomography system and the magnetic resonance signal is received in response to the at least one excitation pulse.

6. The method of claim 5, wherein, during the analysis phase, no electromagnetic radiation is emitted by the transmit antenna.

7. The method of claim 1, further comprising:
creating an image depending on the interference-suppressed magnetic resonance signal.

8. The method of claim 1, wherein, in the determining of the first weighting factors, an influence of the first interference source on a combination of the first analysis signals is minimized in accordance with the first weighting factors, and/or
wherein, in the determining of the second weighting factors, an influence of the first interference source and an influence of the second interference source on a combination of the second analysis signals is minimized in accordance with the second weighting factors.

9. The method of claim 8, wherein a variation method, a linear optimization method, or a method in accordance with a least squares method is carried out in order to minimize the influence of the first interference source and/or in order to minimize the influence of the first interference source and the second interference source.

10. The method of claim 1, wherein, based on the first analysis signals, at least one first characteristic variable of the first interference source is determined, and the first weighting factors are determined depending on the at least one first characteristic variable, and/or
wherein, based on the combination of the second analysis signals, at least one second characteristic variable of the second interference source is determined and the second weighting factors are determined depending on the at least one second characteristic variable.

11. The method of claim 1, wherein the first interference source is identified as a frequency-discrete interference source and the second interference source is identified as a noise-like interference source.

12. The method of claim 11, wherein, during the analysis phase, one or more further frequency-discrete interference sources are identified, and wherein the first weighting factors are determined such that an influence of the one or more further frequency-discrete interference sources is at least partly suppressed.

13. The method of claim 1, wherein, based on the first analysis signals, a first interference bandwidth of the first interference source is determined,
wherein a further first analysis signal is received by the main receive antenna and a further first analysis signal is received by each auxiliary receive antenna of the at least one auxiliary receive antenna,
wherein a receive bandwidth is defined for receiving the further first analysis signals depending on the first interference bandwidth, and
wherein the first weighting factors are determined based on the further first analysis signals.

14. The method of claim 13, wherein, based on the second analysis signals, a second interference bandwidth of the second interference source is determined,
wherein a further second analysis signal is received by the main receive antenna and a further second analysis signal is received by each auxiliary receive antenna of the at least one auxiliary receive antenna,
wherein a receive bandwidth is defined for receiving the further second analysis signals depending on the second interference bandwidth, and
wherein the second weighting factors are determined based on the further second analysis signals.

15. The method of claim 1, wherein, based on the second analysis signals, a second interference bandwidth of the second interference source is determined,
wherein a further second analysis signal is received by the main receive antenna and a further second analysis signal is received by each auxiliary receive antenna of the at least one auxiliary receive antenna,
wherein a receive bandwidth is defined for receiving the further second analysis signals depending on the second interference bandwidth, and
wherein the second weighting factors are determined based on the further second analysis signals.

16. A magnetic resonance tomography system comprising:
a main receive antenna and at least one auxiliary receive antenna arranged outside an examination region, wherein the main receive antenna and the at least one auxiliary receive antenna are each configured to receive a first analysis signal during an analysis phase; and
an interference suppression facility, which is configured, based on the first analysis signals of the main receive antenna and the at least one auxiliary receive antenna, to determine a first interference source and to determine first weighting factors for the main receive antenna and the at least one auxiliary receive antenna in order to suppress an influence of the first interference source at least partly,
wherein the interference suppression facility is configured, in accordance with the first weighting factors, to create a combination of second analysis signals, wherein a signal of the second analysis signals is received during the analysis phase by the main receive antenna and a signal of the second analysis signals is received during the analysis phase by the at least one auxiliary receive antenna and, based on the combination of the second analysis signals, the interference suppression facility is configured to determine a second interference source,
wherein the interference suppression facility is configured to determine second weighting factors for the main receive antenna and the at least one auxiliary receive antenna in order to suppress the influence of the first interference source and to suppress an influence of the second interference source at least partly, and
wherein the interference suppression facility is configured to create an interference-suppressed magnetic resonance signal as a combination of a magnetic resonance signal and interference signals, wherein during an examination phase lying after the analysis phase, the magnetic resonance signal is received by the main receive antenna and an interference signal is received by each auxiliary receive antenna of the at least one auxiliary receive antenna.

17. The magnetic resonance tomography system of claim 16, further comprising:
a transmit antenna; and
a control unit configured to activate the transmit antenna such that the transmit antenna transmits at least one excitation pulse into the examination region during the examination phase and/or does not emit any electromagnetic radiation during the analysis phase.

18. A computer program product having a computer program, wherein, when the computer program is executed by a magnetic resonance tomography system having a main receive antenna and at least one auxiliary receive antenna arranged outside an examination region, the computer program causes the magnetic resonance tomography system to:
receive, during an analysis phase, a first analysis signal by the main receive antenna and a first analysis signal by the at least one auxiliary receive antenna;
determine, based on the first analysis signals of the main receive antenna and the at least one auxiliary receive antenna, a first interference source and first weighting factors for the main receive antenna and the at least one auxiliary receive antenna in order to suppress an influence of the first interference source at least partly;
receive, during the analysis phase, a second analysis signal by the main receive antenna and a second analysis signal by each auxiliary receive antenna of the at least one auxiliary receive antenna;
create, using the first weighting factors, a combination of the second analysis signals of the main receive antenna and the at least one auxiliary receive antenna;
determine, based on the combination of the second analysis signals, a second interference source;
determine second weighting factors for the main receive antenna and the at least one auxiliary receive antenna in order to suppress the influence of the first interference source and an influence of the second interference source at least partly;
receive, during an examination phase after the analysis phase, a magnetic resonance signal from the examination region by the main receive antenna and an interference signal by each auxiliary receive antenna of the at least one auxiliary receive antenna; and
create an interference-suppressed magnetic resonance signal as a combination of the magnetic resonance signal and the interference signals, depending on the second weighting factors.

* * * * *